United States Patent [19]

Cann

[11] Patent Number: 4,577,461

[45] Date of Patent: Mar. 25, 1986

[54] SPACECRAFT OPTIMIZED ARC ROCKET

[76] Inventor: Gordon L. Cann, P.O. Box 279, Laguna Beach, Calif. 92652

[21] Appl. No.: 506,876

[22] Filed: Jun. 22, 1983

[51] Int. Cl.$^4$ .............................................. F03H 1/00
[52] U.S. Cl. ........................... 60/203.1; 219/121 PN; 313/231.41
[58] Field of Search ................. 60/202, 203.1, 39.461, 60/39.462; 313/231.31, 231.41, 362.1; 219/121 PN

[56] References Cited

U.S. PATENT DOCUMENTS

| | | | |
|---|---|---|---|
| 2,862,099 | 11/1958 | Gage ............................ | 219/121 PN |
| 2,919,370 | 12/1959 | Giannini et al. ................ | 313/231.31 |
| 3,016,693 | 1/1962 | Jack et al. .......................... | 60/203.1 |
| 3,309,873 | 3/1967 | Cann .................................. | 60/203.1 |
| 3,413,509 | 11/1968 | Cann et al. .......................... | 313/161 |
| 3,425,223 | 2/1969 | Browning ........................... | 60/203.1 |
| 4,150,540 | 4/1979 | Krayenbuhl et al. ............. | 60/263 X |

*Primary Examiner*—Louis J. Casaregola
*Assistant Examiner*—Donald E. Stout
*Attorney, Agent, or Firm*—Sherman and Shalloway

[57] ABSTRACT

This invention relates to a thruster apparatus applicable to the environment of a space vehicle or satellite and operable for positioning such vehicle or satellite in the proper orbital location. The device utilizes a unique configuration of passageways to convey the propellant to a location adjacent an electrical arc forming device. The propellant, heated thereby, then travels out a nozzle section of the thruster to thereby produce thrust. If desired, an external heater may be provided to preheat the thruster to thereby contribute to greater efficiency in the use of propellant. Further, if desired, the thruster may include an accelerator extension.

23 Claims, 9 Drawing Figures

SPACECRAFT OPTIMIZED ARC ROCKET

BACKGROUND OF THE INVENTION

1. Field of the Invention

This invention relates to a device capable of heating fluids to temperatures over 1800° F. with a specific application as a thruster for orbital positioning or artificial earth satellites and orientation, orbital positioning, or primary propulsion of space vehicles. The device disclosed is of the type that uses an enclosed electric arc to heat propellants such as, for example, hydrazine, ammonia, nitrogen, hydrogen or bipropellant. fuel to a desired temperature prior to expansion out of a rocket propulsion nozzle. This heating to attain performance enhancement provides a high propulsive specific impulse that is in excess of that obtainable by controlled chemical reaction alone or from an electrical augmentation device or engine using electrical resistance heaters.

At present, catalytic and electrically augmented (resistance-heated) thrusters are normally used during the lifetime of three-axis stabilized or spin-stabilized satellites in order to place in, to change or to maintain orbit station. For synchronous orbit satellites, this lifetime is on the order of 8–10 years. Satellite on-board propulsion is frequently required to make major and minor corrections to achieve final orbit circularization and/or orbit station. When this is accomplished through utilization of a typical chemical reaction engine, large quantities of propellant may be expended. Use of a performance-augmented engine (using electrical energy to extend the nominal chemical reaction performance level) for this function would conserve and retain more fuel for on-orbit functions. Typically, excess electric power is available on a spacecraft even during orbit/station insertion maneuvers. Correction firings are time-spaced, with off periods between firings permitting battery recharge for subsequent firings. By this augmentation process, fuel usage can be reduced by as much as 50 percent or more.

Thrusters may also be used for correcting a satellite orbit which has decayed, or for repositioning the satellite to another location or station. Such thrusters can also be used for propelling satellites which follow other satellites, or for evading tracking satellites. Another application of the performance-enhanced engine is that of changing the orbital path of a satellite in order to make ground tracking difficult or impossible. An application of this type would be for satellite maneuvering procedures undertaken for the purposes of decoying or saturating would-be tracking capabilities of adversaries.

In usage, this engine could be ground-controlled by the spacecraft operating agency, or in some instances of covert operation may, if desired, be preprogrammed for on-orbit automatic control.

The utilization of electrical augmentation of propellant propulsion performance by means of a resistance heater is well known. Prior to the advent of practical application, the use of an electric arc to heat gases was documented, and several devices were built and laboratory-tested. With the actual flight usage of electrical resistance-heat augmented propulsion, it is now feasible to further increase propulsion performance by making specific configuration adaptations of the resistance heater devices to permit changeover to an arc heater in the thruster. Following implementation of an arc heater as a practical flight device, it is possible to further expand the engine to include self-generated or externally-applied electric or magnetic fields to provide additional propellant acceleration. The prior art and configuration approaches of hypothetical arc and arc plus accelerator devices did not address critical problems of isolation and insulation of the arc from the mounting structure or the power or thermal heat transfer efficiencies required for a useful device. Nor did they address the types of propellant and flow characteristics typical with actual flight systems with reference to how they would interact with the arc heater, nor the configuration dependence that results from flight control constraints.

The present invention addresses these constraints and provides particular design features and configurations that can make use of an arc-heated augmentation engine both possible and useful.

2. Brief Description of the Prior Art

Prior art thrusters known to applicant are of three types; those using a chemical reaction energy, those using a resistance-type heater to augment propulsive performance, and laboratory models of electric arc heaters with limited adaptability for actual spacecraft use.

Liquid-propellant fueled spacecraft engines operate at performance levels limited by the chemical reaction energy of the propellant. Performance is generally maximum for steadystate operating of more than a minute and reduced for pulsing operation. For a monopropellant-fueled engine (i.e., hydrazine) either a catalyst bed or a thermal decomposer is used to initiate the exothermic reaction process. Of these processes the catalyst bed is the more common usage. The thermal decomposer is typically brought to operating temperature by means of an electrical resistance heater. These decomposers serve only to initiate the chemical reaction, but do not add to or augment the chemical performance level. To extend the performance level, high temperature electrical resistance heaters are being used to boost the chemical performance level, thereby increasing the propellant temperature prior to its expansion through a nozzle. The devices that use a resistance-type heater are limited to the operating temperatures of the heat exchanger (under approximately 3500° F.).

With prior art arc-heated laboratory thrusters, the expansion nozzle also serves as the device anode. While this would be acceptable in the laboratory, it may not be useful for many flight applications. Further, the prior art commonly uses electrical energy exclusive of propellant chemical energy, thereby eliminating from use the majority of the propellants which have been flight-qualified and are at present being used. The prior art also typically postulates the use of low molecular weight gasses or liquids as the propellant to enable the arc design to operate more easily and to obtain high specific impulses. Use of this type of propellant makes propellant storage and handling more difficult and may result in adverse spacecraft interactions. Further, no attention nor provision was given to the use of a chemically reactive propellant typical of all current flight systems.

The prior art of laboratory arc thrusters recognizes the requirements to cool the electrodes and to transfer heat from the electrodes and arc to the gas. No design attention has been given until now to thermal and electrical isolation from the propellant or mounting systems or to meet a practical usage requirement to match the device voltage to that of the space vehicle.

Prior studies of propellant accelerators combined with basic arc generators also lack understanding of the requirements and design basics that are needed for flight implementation. The following prior art is known to applicant: U.S. Pat. Nos. 2,919,370, 3,056,257, 3,149,459, 3,279,177, 3,304,719, 3,359,734, 3,447,316, 3,460,758, 3,521,453, 3,618,324, 3,651,644, 3,695,041, 3,772,885, 3,871,828, 3,956,885, 4,059,415, 4,288,982, 4,305,247: British Pat. No. 749,921; Publications: "Electric Propulsion Development" by E. Stuhlinger, March 14–16, 1962; "Survey of ElectroMagnetic Accelerators for Space Propulsion" by S. Domitz, et al., March 1966; "Flow Field Characteristics and Performance Limitations of Quasi Steady Magneto Plasma Dynamic Accelerators" by M. J. Boyle, K. E. Clarke and R. G. Jahn, March, 1975.

Further, applicant is either the sole inventor or a co-inventor in the following U.S. Pat. Nos. 3,243,954, 3,309,873, 3,324,316, 3,388,291, 3,413,509, 3,449,628, 3,452,249, 3,453,469, 3,453,474, 3,453,488, 3,453,489, 3,462,622 and 3,467,885. Below, applicant discusses those patents of the above-listed patents which applicant deems to be pertinent to the subject matter of the instant patent application. Those patents not discussed herein are believed to be of only general interest.

The type and general configuration of accelerator disclosed herein is related to some of the above-listed prior art patents. In theory, it works using some of the mechanisms disclosed in U.S. Pat. Nos. 3,388,291, 3,243,954 disclosed herein was generally disclosed in U.S. Pat. No. 3,413,509. Feeding some propellant through the cathodebuffer (about 10%) and the rest of the propellant (about 90%) through the anode was also generally disclosed in U.S. Pat. No. 3,413,509. The concept of electric field reversal at a sonic point is disclosed in 3,467,885.

The invention herein includes the following features:

1. The use of the buffered cathode and the feeding of approximately 90% of the propellant thru the anode in a space propulsion engine. In U.S. Pat. No. 3,413,509, by way of contrast, these features were incorporated into a plasma confinement device.

2. Matching the operation voltage of the propulsion engine to the bus voltage available on the spacecraft using a theoretically derived equation to define the voltage in terms of engine design parameters, a concept not shown in the prior art as disclosed herein.

3. Use of a nested set of disc-cylinder shields mounted on insulators to act both as thermal radiation shields and vacuum electrical insulators, a concept also not disclosed in the prior patents.

4. The use of a theoretical relation among the discharge current, the strength of the applied magnetic field, the ionization potential levels of the propellant as well as its molecular weight, and the geometry of the engine to establish a relation between the thrust and the required mass flow rate of propellant for stable and efficient operation of the accelerator, which relation is not previously disclosed in the above patents.

5. An anode configuration previously undisclosed in the prior patents and specifically designed to give a high mass utilization of the propellants and hence make a more efficient space propulsion engine.

SUMMARY OF THE INVENTION

The present invention concerns itself with a nominal 0.01 to 10 $lb_F$ thrust space vehicle control engine which derives electrical and/or magnetic field acceleration of propellant such as, for example, hydrazine. Use of the space vehicle's electric power to augment and/or induce propellant dissociation can result in achievement of more thrust per unit mass of propellant as the propellant temperature or energy per unit mass is raised to increasingly higher values.

Since space vehicle launch capabilities limit the mass of the space vehicle which in turn limits the mass of material that can be carried as propellant, the higher the temperature and/or the energy per unit mass of the propellant exhaust flow, the less fuel used per thruster actuation and thus the longer the useful lifetime of the space vehicle or the higher the pay load potential. In the cases where space refueling is to be employed, higher engineered propellant efficiencies reduce the refueling requirements by extending the refueling cycle or lessening the refueling amount. Extensive development has been directed to the handling, storage and control of several hydrazine-based space vehicle propellants which are presently used on over 90 percent of the operational satellite systems. These systems primarily rely on the chemical energy in the propellant for the propulsive power. An objective of the present invention is to use all possible means within the limitations imposed by materials to heat or otherwise energize typical spacecraft propellants (such as hydrazine) to as high a temperature or energy level as is possible using the available spacecraft electric power (100 watts to several thousands of watts). This electrically powered energizing is incorporated in the rocket engine or thruster to augment or extend the performance that would be available by normal chemical reaction. The electrical energy is transferred to the propellant by means of an electrical arc and the transfer mechanism is accomplished as efficiently as possible with a minimum of thermal and power loss.

It is, accordingly, an object of the present invention to provide a thruster which is able to operate with standard inventory spacecraft propellant and standard flight engine mounting and interface techniques. The arc heater itself comprises a unique design modification of the basic arc heater with a cylindrical cathode centered within a tubular anode. The propellant flow preferably passes through regenerative cooling channels in the anode to capture as much as possible of the anode heat and then some fraction enters an inner core to be directly heated by the arc.

A specific feature of the present invention comprises the inclusion of a mixing-expansion section downstream of the electric arc. This feature permits mixing and recombination of the arc heated propellant flow with that part of the propellant that bypassed the arc. The propellant that flows through the arc will be partially ionized and dissociated and would normally pass through the nozzle as hot core flow without recombining and with a minimum conversion of the ionization and dissociated energy to useful thrust. However, it is also desirable, for higher efficiencies, to maintain a cooler layer of gas flow next to the chamber wall. The configuration of this section is therefore a design balance to first permit a recombination of the flow that is ionized and dissociated in the arc by mixing with some of the flow that bypassed the arc and, second, to constrain the amount of mixing so as to maintain a cooler gas flow next to the wall to minimize wall heat loss. An optimum balance of these two factors significantly increases the performance efficiency of the thruster.

The hot mixed gas then enters a sonic orifice and is expanded to a high Mach number through an expansion nozzle optimized for a maximum thrust and minimum power loss.

To achieve standard spacecraft interface compatibility, the tubular anode is enclosed and insulated from the thruster outer structural wall. The outer chamber thus formed provides propellant containment and the propellant inlet and exit nozzle. It also serves as the electrode holder through insulated couplings and mounting structure attachment. As such, the electrodes are completely isolated from the mounting interface and standard spacecraft design may be used for the mounting interface. The propellant injector may also be a standard high temperature metallic coupler (as compared to a high temperature non-metallic insulator flow coupler that would be required by other designs and concepts).

It is a further objective to increase the efficiency of heat transfer from the arc by increasing the ratio of the thermal energy transferred to the propellant over thermal energy loss.

It is a further objective to provide a thermal capacity within the device and a variability of arc voltage to permit operation over a wide range of propellant inflow conditions. This will enable the thruster to work with the standard technology of propellant flight systems rather than requiring use of more costly, heavier and unproven propellant flow controls.

Propellant flow within the present invention is divided so as to (1) regeneratively cool the anode and then flow through the arc, and, (2) allow a portion of the inflow to pass over the outer surface of the anode and enter into the mixing area with the arc-heated stream near the nozzle entrance. All flow is injected into the device tangentially to establish a vortex flow pattern within the device itself. This vortex flow pattern will establish a thermal gradient within the flow channels with the cooler side being nearer the outer housing containment wall. This thermal gradient will be also established in the flow that is channeled over the outer surface of the anode. While a portion of this bypass flow will subsequently mix with the arc heated flow, a cool layer will persist next to the containment chamber wall and continue as a boundary layer through the nozzle. This swirling layer will serve to reduce the heat loss through these sections. Spiral flow channels and internal radiation shields are designed and placed to enhance this thermal gradient effect in the flow.

It is a further object to provide such a thruster which has both an effective means of maintaining heat in the device and yet maintains a relatively cool exterior surface, thereby presenting a cool and more thermally efficient attachment point for a supporting structure.

It is a further object to provide a thruster which, despite maintaining heat within the thruster, presents a cool exterior surface which emits a minimum amount of radiation.

A division of the inflow of propellant in this device provides several unique features of the invention. The operating voltage and the stability of an arc are related to flow conditions through the arc. The wider the range of flow rate and operating pressure, the larger adjustment that is required of arc voltage and/or arc length. The flexibility of having parallel flow paths permits additional adjustments to match the arc device with a less flexible spacecraft power supply. Accordingly, in one aspect of the invention, the device is provided with an arc heater assembly located within a heater cavity which has a propellant guiding structure surrounding the heater cavity.

The above described division of the inflow and multiple injection inlets allows for preferential injection of different propellants or mixes of propellants. For example, a propellant that would react deleteriously with the electrodes could be injected downstream of the electrodes. An inert gas could then be separately injected through the arc, after regeneratively cooling the anode, and then combine with the reactive gas in the mixing section. Common bipropellants, such as monomethyl hydrazine (MMH), will generally be unacceptable for use in an electric propulsion device, since at reaction temperatures and above, the propellant may leave carbonaceous deposits that are likely to block flow passages. With the present invention, this propellant may be injected downstream of the arc forming electrodes and then mixed with a nonproblematical propellant which is separately injected to flow through the arc column. A propellant, such as MMH, may be used singly in the device if many of the higher efficiency regenerative flow passages are eliminated or minimized.

The propellant guiding structure may also be formed in multiple layers to provide plural thermal zones of increasing temperatures for the propellant as the propellant is passed through the structure. In order to retain heat within the device, this multiple layer guiding structure may also function as or together with thermal shields. These multiple layers will be separated by means of physical indentations or by being preformed by means of thermal processing. Shields are also used externally of the containing structure. The function of these external shields is to further reduce the external heat loss from the device. These shields may be formed and separated by the same means as the internal shields. While all of the shields will have a low emissivity in order to reflect and hold heat inwardly, the outermost exterior surface of the device may have a coating or may be treated to have a high emissivity in order to present as cool an exterior surface as possible.

The device may be supported by a structure of low thermal conductivity which also may feature material cut-outs, and extended length to minimize heat loss through the mounting structure. This structure may be arranged with folds in order to compact this extended length. A configuration of this type of structure could be in the form of concentric tubes with alternating end couplings. This thermal isolation of the device minimizes the spacecraft thermal interface problems as well as helping to achieve higher device thermal efficiencies.

The arc heater itself is an assembly of component parts which may be built together and tested separately from the containment chamber. This approach permits a full ground test and check-out of the arc heater as a component prior to inclusion into a thruster. Typical thruster and spacecraft test environments are harmful to an arc heater. This invention circumvents the problem and eliminates the need for expensive special test facilities for the preflight verification of flight thrusters on the spacecraft.

The construction is such that the fuel passageways are formed as helix threads or as grooved passageways extending in plural layers along the length of the thruster housing coaxial with the heater cavity. The concentric relationship of the fuel passageways and associated structure, including the shields, permits the thruster to be assembled with a minimum of weldments or other fastening devices.

Space vehicles typically may have power systems of 24–50 volts and most arc devices are unable to operate at these relatively low voltages. An aspect of the invention with bypass flow capability permits control of the amount and temperature of the flow that passes through the arc column. This control can constrain the arc column voltage to a level that will interface with standard space vehicle power supply voltages. Non-standard power supply voltages are required if all of the propellant flow is required to pass through the arc. By this invention, the increased system weight and power efficiency loss associated with a higher, non-standard voltage power conditioner are eliminated.

The propellant injected into the device may be decomposed or reacted propellant in the gaseous phase coming from an attached or separate catalytic or thermal decomposition chamber. However, the device may be provided with an injection passage such that unreacted liquid propellant could be introduced and heat from an attached external heater or heat from the performance augmentation section (after initial start-up) would thermally decompose it without using a less efficient external chamber.

The fluid passageways may be coated or plated with a material that is resistant to chemical interaction or with a material that will enhance the dissociation process of the propellant.

In a further aspect of the invention, a thruster assembly such as described above is formed with a nozzle having a nozzle throat insert. The nozzle throat insert has a high-temperature capability, whereas the remainder of the expansion area of the nozzle is not required to have the same high temperature properties. The insert construction also provides a diaphragm means which reduces thermal emissions from the thruster's nozzle portion.

It is also an objective to have the option to further increase the propulsive performance by means of application of self-generated and/or externally-applied electric and/or magnetic fields to increase the exhaust velocity of the propellant. This acceleration is accomplished by configuring an axisymmetric channel accelerator in which components of the electric and magnetic fields are maintained at right angles to each other and transverse to the "channel" through which the propellant from the arc is caused to flow. An electric field transfers energy to charged particles, and a magnetic field exerts a force on charged particles in motion relative to the magnetic field. When a magnetic field is established at right angles to a moving stream of electrically conductive fluid, an electric field is induced perpendicular to both the stream direction and the magnetic field lines. Application of an electric field in the same direction as the induced electric field, but stronger than the induced electric field, causes current flows in the conductive fluid in the direction of the applied electric field, which current interacts with the magnetic field to produce a force which is in the direction of the moving stream. In accordance with commonly used vector notations, the net current density is denoted by "j" and the magnetic flux density denoted by "B." Hence, the conventional crossed-field channel accelerator is also known in the art as a "jXB" channel accelerator.

However, in a linear JXB channel accelerator, the electrical current does not actually flow perpendicular to the electrodes, but rather flows at some other angle due to the phenomenon known as "Hall effect." When the Hall potential is zero, the net resultant current is the combination of the "ordinary" currents (current due to the applied electric field, plus current induced by movement of electrons through the magnetic field) and the Hall currents.

It is the intent of this disclosure to include the more advantageous configurations of the Hall accelerator with the arc thruster rocket of this invention. Accordingly, it is an object of the present invention to provide improved plasma accelerators.

It is also an object of the present invention to accelerate an ionized gas plasma without any significant spreading or deflection of the jet.

It is another object of the present invention to provide an electromagnetic plasma accelerator in which the electrodes are maintained at a relatively low temperature to minimize electrode erosion and consequential electrode sputtering.

It is a further object of the present invention to provide a steady-state plasma accelerator in which Hall currents are used to provide an additional measure of acceleration.

It is yet another object of the present invention to provide an improved plasma accelerator in which the "joule heating" of the gas plasma is converted into directed axial jet energy.

It is still a further object of the present invention to provide means for insuring that the thrusters do not supply any unwanted torque to the spacecraft. Conventionally, stationkeeping and other maneuvers of satellites is accomplished by firing two identical thrusters simultaneously. When this is done, the torque of one engine, which is given by $$\text{Torque} = \tfrac{1}{2} B_A I R_A^2$$

for a single solenoidal magnet, wherein
 $B_A$ = axial magnetic field at the anode
 $I$ = arc current
 $R_A$ = radius of the anode
can be opposite to that of the other by reversing the direction of the current thru the magnet and the spin direction of the gas. In this way no net torque is applied to the spacecraft.

The objects of the present invention are accomplished by partially ionizing a gas stream, accelerating the jet to supersonic velocities through a nozzle, and accelerating the jet through axisymmetric magnetic fields and a secondary electrical discharge extending axially downstream throughout the length of the magnetic fields. Tangential Hall currents are generated by the current density lines crossing the magnetic field lines, the Hall currents then interacting with the radial components of the magnetic field to impart axial acceleration to the gas.

Since the accelerator fully ionizes the propellant and the ionized propellant (plasma) is magnetically confined, the engine performance is not dependent upon the temperature of the engine components, except for the cathode tip. The engine can therefore be operated in a pulsed or quasisteady state mode having pulse durations of milliseconds up to several minutes. The pulse duration and pulse rate are selected to provide the average thrust and total pulse required for a manuever within the limits of the power available from the spacecraft power supply according to the following set of engine/mission optimizing conditions:

1. utilization of all excess energy available from the spacecraft power supply
2. minimizing of the total mass of the propellant needed to accomplish the mission
3. minimizing of the mass of the engine.

Operation of the arc-accelerator in this optimized pulse or quasi-steady state mode permits engine component and total engine weight reductions of over fifty percent from that which is required when only steady state operation is possible. For example the magnet coil weight could be reduced by as much as seventy-five percent as compared with a steady state operating coil and would have sufficient heat capacity as well as radiative capacity to accommodate all attendant heat build-up. Under this operating mode, these coils will operate at lower temperatures and will thereby be more electrically efficient.

Further, operation in the pulsed or quasi-steady state mode permits the option of direct injection of liquid propellant, i.e. hydrazine, into the anode with elimination of the need for a separate catalytic or thermal decomposer bed.

The following table shows a comparison between various operating parameters of different types of spacecraft engines known to applicant and illustrates, mainly, the estimated weight reduction achieved by the instant invention:

| Engine Type | Thrust (lbs f.) | Propulsion Performance Isp Sec. | Thrusting Time | Thrusting Period | Approximate Weight of Propulsion System for 10-year Mission (lbs.) |
|---|---|---|---|---|---|
| Catalytic Hydrazine Resistance Heated | .080 | 240 | 90 min. | 30 days | 200 |
| Augmented Catalytic | .080 | 300 | 90 min. 45 min. | 30 days 15 days | 150 |
| Arc Heated Hydrazine | .080 | 500 | 45 min. 15 min. | 15 days 5 days | 100 |
| Hall Accel. Using Hydrazine In Pulse Mode | .080 | 1600 | 3 min. | 1 day | 70 |

DETAILED DESCRIPTION OF THE PREFERRED EMBODIMENTS ARC THRUSTER

Figure 1:
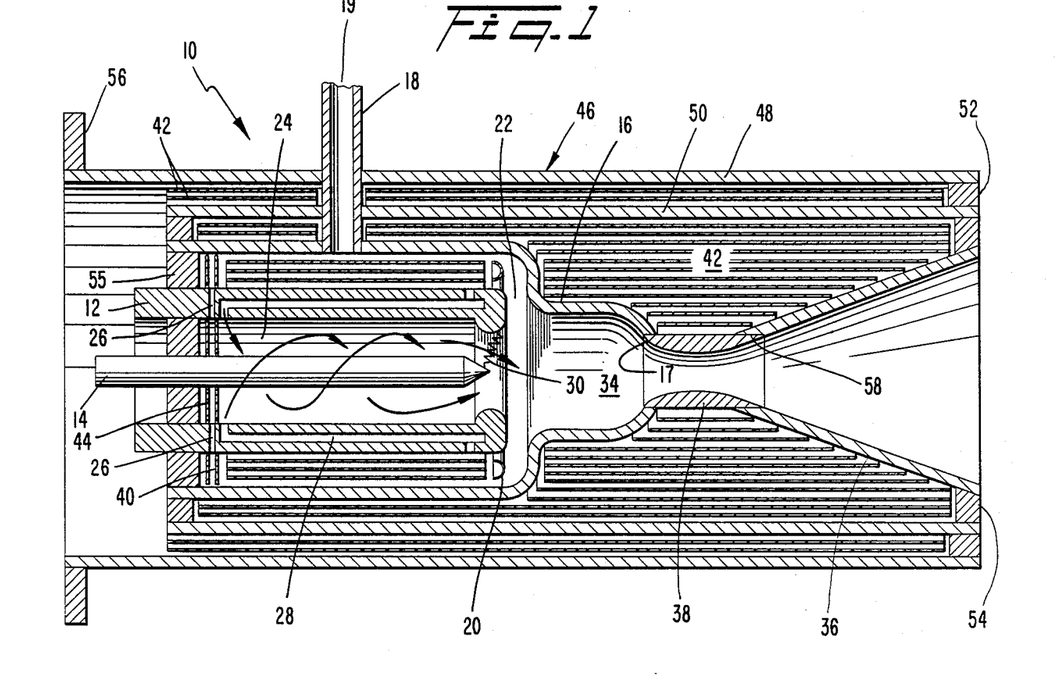
FIG. 1 is a cut-away side view of a thruster according to the present invention.

Referring to FIG. 1, a thruster assembly 10 according to the present invention is comprised of an anode 12, cathode 14 and a containment chamber 16. Attached to the containment chamber 16 is a propellant injector 18 through which propellant is conducted at ingress opening 19. The propellant enters into the vortex shaped flow dividers and channels 20 causing a swirl or vortex flow pattern as well as a separation of flow into components. A portion of the flow at 22 swirls around the anode, bypassing the arc, regeneratively cooling the containment chamber wall through contact therewith. Another portion swirls to the base of the device and then enters the arc core flow channel 24 through bypass passages 26. The third portion of the flow is caused to enter the anode 12 through annular passages 28 to regeneratively remove anode heat through contact with the anode interior. As this flow exits the anode 12 it enters the arc core flow channel 24, passes through the arc 30 and then enters the flow mixing-expansion section 34. This division of flow permits operation of the arc at lower voltage than would be required if all of the flow passed through the arc 30. This is because the lower flow rate caused by this division of flow has less tendancy to extend the arc path. Less mass going through and being heated directly by the arc column results in lower column voltage. The partially ionized and dissociated flow from the arc core flow channel 24 is combined with the flow that bypassed the arc area 30. This combining of gases in a mixing chamber will tend to equilibrate their temperatures and will efficiently convert most of the ionization and dissociation energy of the arc column gas to thermal energy in the bypass gas which is then converted to useful thrust in the nozzle.

Figure 4:
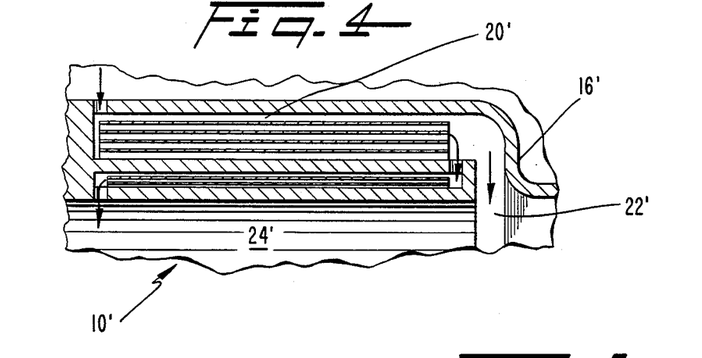
FIGS. 4, 5 and 6 show three alternative constructions for a portion of the propellant flow path.
Figure 5:
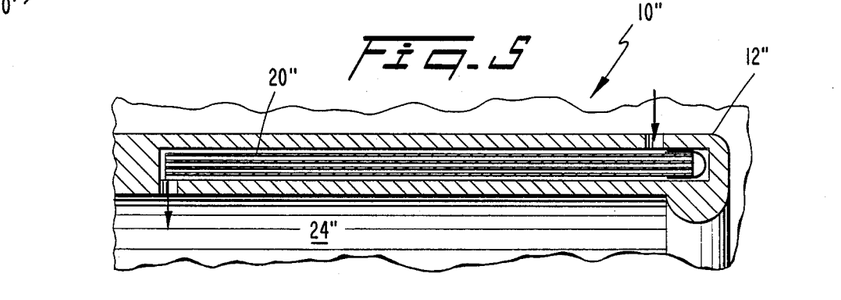
Figure 6:
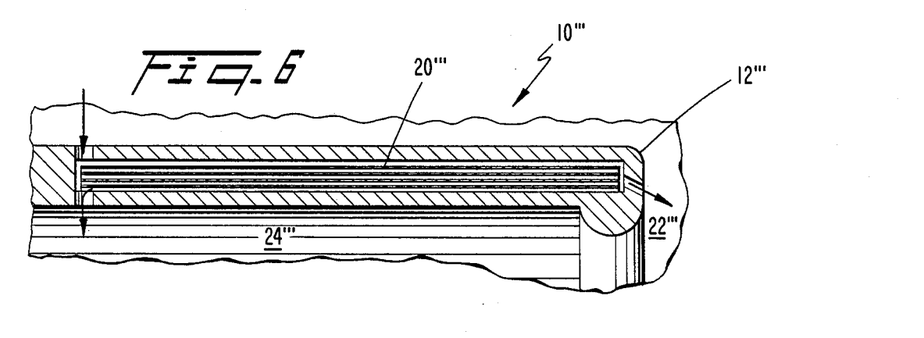

Most of the divided flow is mixed in the flow mixing-expansion section 34; however, some of the cooler bypass flow will remain nearest the wall up through the nozzle 36 this maintaining a beneficial thermal gradient. The flow passes through the nozzle throat 38 and then out through the expansion nozzle 36. Referring still to FIG. 1, the flow divider and flow channels 20 may be formed as part of the containment chamber 16 and/or the anode 12 and/or include separate components which could also function as internal radiation shields. (In FIGS. 4–6, like elements are given like primed reference numerals) FIG. 4 shows a fragmentary view of the thruster showing containment walls 16'. The flow dividers and channels 20' including one outlet leading to location 22' and a second outlet leading to arc core flow channel 24' are shown formed as a part of the containment chamber 16'. Referring to FIG. 5, in this embodiment, the flow dividers and channels 20'' are shown as formed as an integral part of the tubular anode 12''. This embodiment shows only a single inlet and a single outlet for propellant flow leading to the arc core flow channel 24''. Referring now to FIG. 6, this embodiment shows the flow dividers and channels 20''' formed as an integral part of the tubular anode 12''' and further including a first outlet for propellant adjacent the area 22''' bypassing the arc and a second outlet admitting propellant flow into the arc core flow channel 24'''. The propellant is caused to have heat transferred to it as it flows through the device for any or all of the following purposes: to vaporize, decompose, react or be heated to higher temperature. The flow channel surfaces may be coated or plated for the purpose of chemically isolating the passages 20 or walls 16 from the propellant or to enhance the decomposition or reaction of the fluid.

The function of the internal shields 40, external shields 42, and electrode shields 44 is to contain and focus radiated energy toward the hot core of the thruster 24, 30, 34. The surface of these shields will have a high reflectivity (low emissivity, $\epsilon < 0.2$).

The support structure 46 is attached to the containment chamber 16. FIG. 1, illustrates a possible version of a method to extend the length of this support. In this illustration, the support is two concentric tubes 48 and 50 connected at one end with a ring 52. These support tubes have material cutouts (not shown) to reduce thermal conduction. This structure may also be used to provide secondary support to the nozzle 36 by means of a low thermal conductivity support ring 54. The support ring 54 may, if desired, be made of an insulating material, such as, for example, boron nitride or a low thermal conductivity, light weight metal such as titanium. Thus, direct heat conduction through the supporting structure must take a long and tortuous path from the internal hot core 24, 30, 34 to the space vehicle mounting in interface 56. This interface will then be relatively cool, thus minimizing the heat conduction to the space vehicle via the device mount 46. An electrically insulative disc 55 extends within chamber 16 adjacent attachment 56 and structurally locates anode 12 and cathode 14 within the thruster 10.

In order to further reduce the temperatures to which the device mount 46 is exposed, the exterior surface of the containment chamber 16 is coated or surface conditioned to obtain a high emissivity coating. A preferred high emissivity coating would be hafnium carbide (HfC). The use of the high emissivity coating on exterior surface would reduce the radiative heat loss to the device mount 56. The reduction in temperature of the outer portion of the concentric support tube would also reduce the amount of radiation transferred away from the thruster to other portions of the space vehicle or to other external attachments or sensors (not shown).

By providing the high emissivity coating on exterior surface 16 and/or on the outer surface of the outer portion of the support tube 46, the operating temperature of the thruster 10 at the propellant hot core regions 24, 30, 34 can be increased even though maintaining a low temperature at exterior surface. This will also enable the thruster 10 to operate at higher efficiencies. It should further be noted that without the use of the folded arrangement of the concentric support tube 46 separated by the laminations of shields 42, it would be necessary to reduce heat loss at the exterior surface of the containment chamber 16 and a low emissivity coating on the exterior surface of the support structure 46 would be less practical. In addition to the support structure 46, various controls are attached to thruster 10. The reduction of temperature accomplished by the use of the high emissivity coating at exterior surface 46 reduces the maximum temperature to which external components of these controls are exposed.

When propellant is being expelled from the mixing and expansion chamber 34 to produce thrust, high temperatures are created at the nozzle throat 38. To withstand these high temperatures, it is necessary to use high temperature or refractory materials at that location. An option is to use a separate insert 38 for the nozzle throat area. The insert extends to connect the containment chamber 16 with the expansion nozzle structure 36. By using a separate insert 38, costly materials are only required for the hottest portions of the containment chamber 16. The expansion section of the nozzle 36 is exposed to a lower temperature. This part of the nozzle can be made as a separate section or shell which covers laminations of external radiation shields 42 which are located in that area. It can be seen that, because of the uncoupled heat-exchange relationship of the insert 38 and the expansion portion 36, the amount of heat loss through the expansion nozzle due to conduction and radiation during the operation of thruster 10 is reduced. In the preferred embodiment the insert 38 is made of thoriated tungsten. Further, the preferred material for the walls of chamber 16 and the nozzle inlet 17 is molybdenum/rhenium, and the expansion nozzle 36 is preferably made of TZM (a moderate cost molybdenum alloy) or titanium.

By separating insert 38 from the expansion portion 36, a means is provided to reduce radiation losses from the nozzle 36. The insert 38 is not mechanically joined directly to the expansion portion 36 and a blocking effect is accomplished by a thin diaphragm 58 between insert 38 and the expansion portion 36. As shown, the diaphragm 58 is located on the expansion side of the nozzle throat 36 and acts as a "block" to prevent propellant flow from entering the radiation shield area 42 through the gap that would otherwise be present between insert 38 and expansion portion 36. Thus, the diaphragm 58 acts as a layer of metal blocking the gap from flow-through. In the preferred embodiment, this diaphragm 58 will be made of a tungsten foil. Therefore less power is transferred from the hot insert 38 to the expansion portion 36.

It is expected that temperatures at the insert 38 will reach a range of 1700°–2000° K., whereas temperatures at the expansion portion 36 will reach a range of 1100°–1400° K. Without a separation of the nozzle portions 36, 38 energy losses would be represented by:

$$P = \sigma \epsilon_n A_n T_N^4;$$

where
  P = power-energy/unit time;
  $\sigma$ = (Stefan-Boltzman) constant;
  $\epsilon_n$ = integrated emissivity of the nozzle 36;
  $A_n$ = effective area of the nozzle 36;
  $T_n$ = temperature of the nozzle 36.

With the separated structure of the preferred embodiment, energy losses would be represented by:

$$P = \sigma \{\epsilon_i A_i T_i^4 + \epsilon_n (A_n - A_i) T_P^4\}$$

where
  $\epsilon_i$ = emissivity 16 of the insert 38;
  $A_i$ = area of the insert 38;
  $T_i$ = temperature at the insert 38;
  $T_P$ = temperature at the expansion portion 36.

These equations are approximate models because of such factors as thermal conductivity and direction of thermal radiation. Using an 0.1 pound thrust arc engine for an illustrative example, the typical power loss values for an integral nozzle without a diaphragm would be:

$$A_N = 3.68 \times 10^{-5} \text{ sq. meters}$$
$$T_N = 2000° \text{ K.}$$
$$\epsilon_w = .35$$
$$\theta = 30°$$

$$\epsilon_N = \frac{1 + \epsilon_w \tan \theta}{1 + \tan \theta}$$

$$= \frac{1 + .35 \times .577}{1.577}$$

$$= .762$$

-continued
$$P = 5.67 \times 10^{-8} \times .762 \times 3.68 \times 10^{-5} \times 2000^4$$
$$= 25.44 \text{ watts}$$

For a nozzle with a diaphragm, approximate values would be:

$$A_i = .098 \times 10^{-5} \text{ sq. meters}$$
$$T_i = 2200° \text{ K.}$$
$$\epsilon_i = .35$$
$$T_P = 1600° \text{ K.}$$
$$P = 5.67 \times 10^{-8}\{.35 \times .098 \times 10^{-5} \times 2000^4 + .762 \times 3.58 \times 10^{-5} \times 1600^4\}$$
$$= .31 + 10.14$$
$$= 10.45 \text{ watts}$$

These examples indicate that the radiative power loss from the nozzle can be reduced by more than a factor of 2 by using the diaphragm and thermal uncoupling.

To configure the arc thruster with a Hall Current accelerator extension, several minor changes are made to the basic thruster and several additional components are added to the device. The are illustrated in FIG. 2, wherein like elements are given like reference numerals with a prime numeral "4."

The current flow is initiated by thermionic emission from the conical tip of the cathode $14^4$. The cathode is surrounded by an anode which now functions as a buffer electrode 60. Gas is injected into this subassembly through the tube 62 and flows tangentially in the cavity $24^4$ and out of the current density control orifice 64. The cathode $14^4$ and buffer electrode 60 are mounted on an insulator 66 using "feed-thru's" that are sealed against leaks from internal pressure. This subassembly 60, $14^4$, 66 and $24^4$ is surrounded with electrical and thermal shields (isolator) 68. With gas injected thru the tube 62, the subassembly consisting of 60, $14^4$, 66, $24^4$, 64 and 68 is an alternate arc-jet configuration and can be operated as such. A solenoidal magnet coil 70 mounted around the shields can be operated in conjunction with the arc-jet to help stabilize operation of the arc and spacecraft power supply combination.

Figure 2:
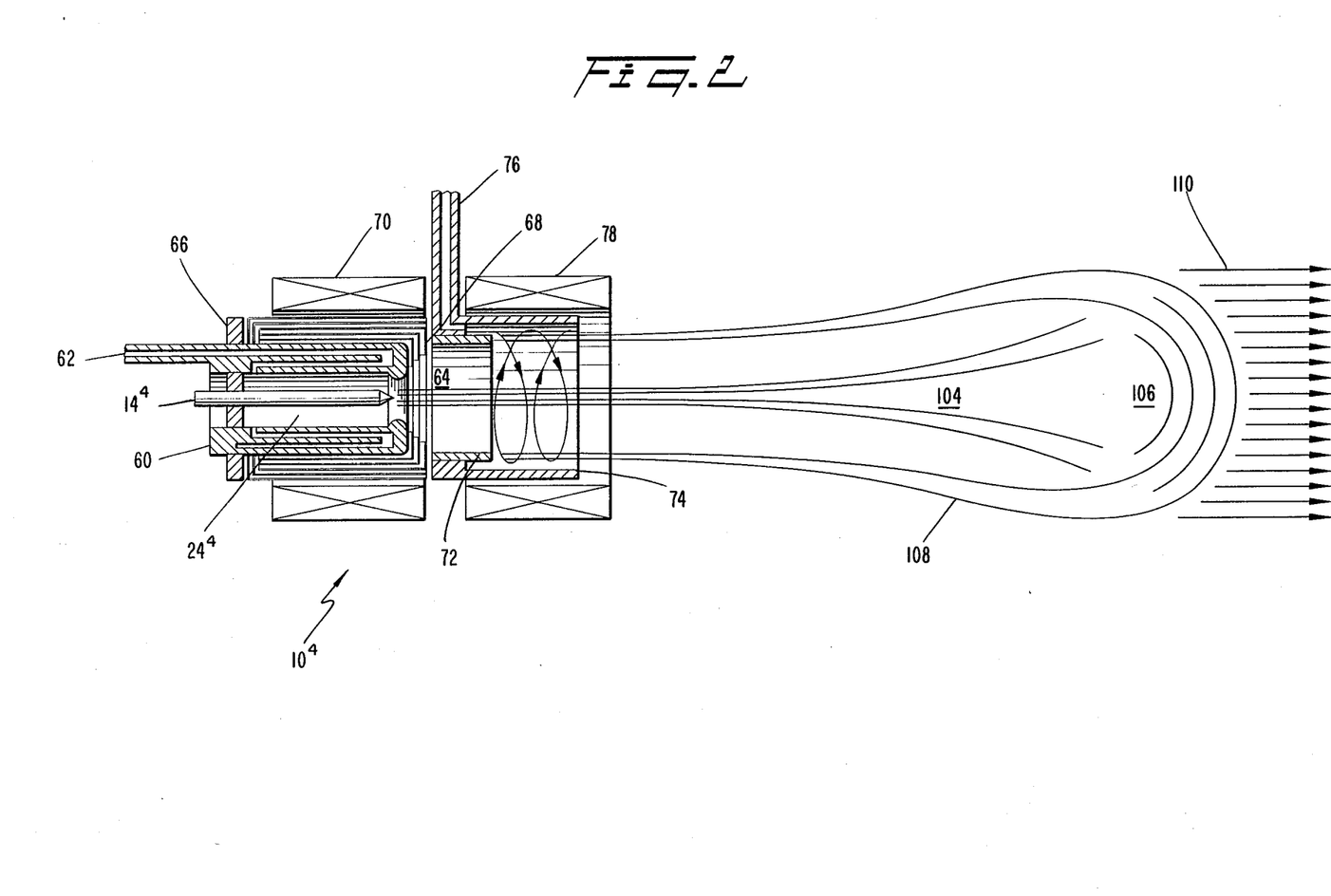
FIG. 2 is a schematic view of a thruster in the configuration as a Hall current accelerator.
Figure 7:
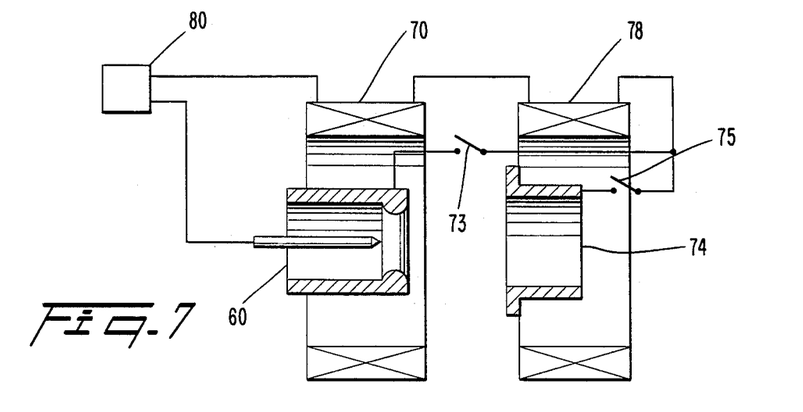
FIGS. 7 and 8 show two alternative embodiments of circuitry for the Hall current accelerator.
Figure 8:
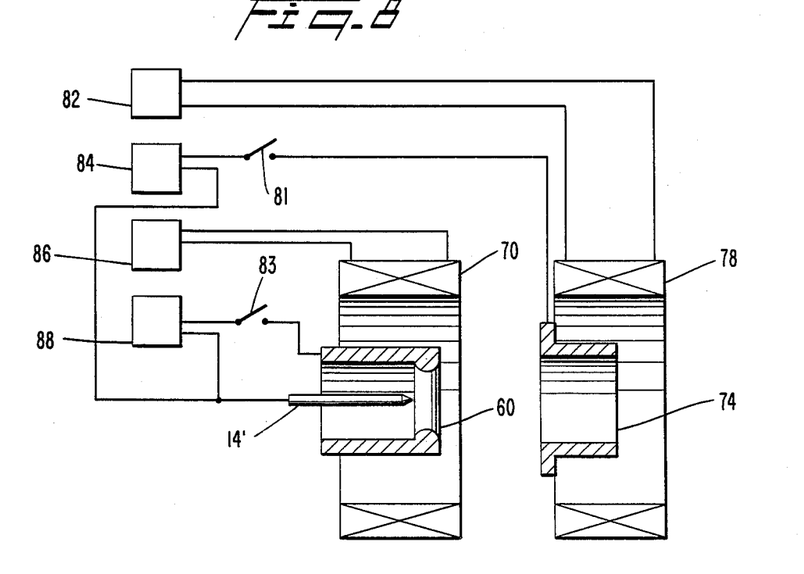

With the inclusion of components 72, 74, 76 and 78 as shown in FIG. 2, the device can be operated in the Hall Current Accelerator mode. In this mode additional propellant flow is injected into the arc heated flow through inlet 76. The arc discharge is transfered from the buffer anode 60 to the accelerator anode 74. Magnets 70 and 78 are energized to create a common polarity, extended magnetic field. Magnets 70 and 78 can be excited by placing them in series with the arc current as shown in FIG. 7 or they can be separately excited as shown in FIG. 8. Switches 81 and 83 may be included if desired. The anodes 60 and 74 are connected in parallel with each circuit including power switches 73, 75 and/or power-limiting resistors well known in the art but are not operated simultaneously. The power supply is referred to by reference numeral 80. Referring now to FIG. 8, this figure shows the configuration with separate power supplies. As shown, a first power supply 82 supplies power to the magnet 78. A second power supply 84 is connected to the accelerator anode 74 and the cathode $14^4$. A third power supply 86 supplies power to the magnet 70 while a fourth power supply 88 is connected between the cathode $14^4$ and the buffer electrode 60. The configuration will operate as a Hall current accelerator. A portion of the propellant is injected into the buffer anode/electrode 60 and is heated by regeneratively cooling the electrode 60 and then passing thru the arc area which is maintained between the cathode tip and inner diameter of the current control orifice 21. This mode of operation can also be used to pre-heat the accelerator anode 74 if the device is also used for thermal decomposition of an exothermic propellant (e.g. hydrazine). The electrical connections shown in FIG. 7 and 8 may be so operated in conjunction with propellant inlet valves (not shown) in a pulsed mode as described in the "Summary of the Invention."

Figure 3:
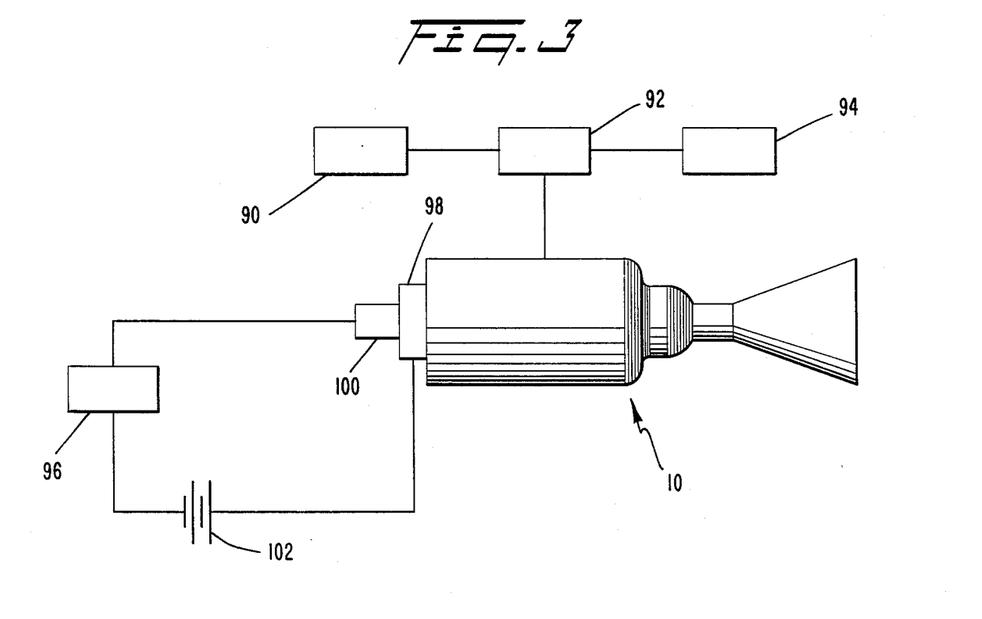
FIG. 3 is a schematic view of a thruster with associated support systems, some of which are subsystems of the carrier space vehicle.

FIGS. 1, 2 and 3 are used to illustrate the operating procedure of the arc jet portion of the invention. Prior to operating the augmentation arc 30, propellant from a space vehicle storage tank 90 must enter and flow through thruster 10. In the case where the propellant must be vaporized, decomposed and/or reacted, this may be accomplished in an external chamber 92, or within the injector assembly at the intersection with flow divider section 20. If this vaporization, decomposition and reaction is induced by thermal energy, an external heat source 94 would be provided by the space vehicle's solar cells or batteries. Such an initial phase of warm-up may typical last several minutes. If catalytic decomposition is used, no prior warm-up is required. With propellant flow in thruster 10, the arc 30 can be initiated. This arc initiation can be accomplished by means of a high-voltage single discharge, or by a high-voltage, high-frequency discharge from an external source 96 coupled to the power leads 98 and 100.

Following arc initiation 30 the arc will be maintained by the space vehicle power supply 102. This power supply 102 may include a power controller and/or regulator (not shown) in addition to the energy supply and storage system, likely batteries. Operating parameters of thruster 10 must be matched to this supply 102 with a minimum of power conditioning or regulation for maximizing overall power efficiency. Specific features of thruster 10 have been included to optimize interaction with standard space vehicle power supplies 102 requiring none or minimum conditioning. These include the variable arc gap and the division of propellant flow.

Typical space vehicle propellant supply systems 90 are of a "blow-down" design; that is propellant supply pressure, and hence the flow rate, will decrease over mission lifetime. The arc augmentation thruster 10 has sufficient heat capacity and a self-adjusting arc gap 30 which operates as is well known in the art to accommodate a wide range of "blow-down" conditions.

When the device is operating in the Hall Accelerator mode, a "virtual cathode" 104 forms which consists of ionized gas flowing along and expanding radially across the magnetic field lines. The expansion rate is such that the combined radial forces due to the self-magnetic field and the azimuthal Hall currents in the jet are adequate to radially confine the pressure exerted by the gas in the cathode jet. Electromagnetic "pumping" forces in the cathode jet accelerate the ions axially against the electric field. Elastic and ionizing collisions between atoms, ions and electrons in the cathode jet also permit radial expansion of the cathode jet; hence the rate of radial expansion can be controlled by adjusting the mass flow rate of propellant injected through the tube 62. Generally speaking, about 1/10th of the total flow will be injected through the inlet 62 and 9/10th's will be injected through the inlet 76. With this general ratio being followed, stable operation of the device will result. Other ratios may be used, if desired.

Once the cathode jet reaches region 106, the axial electric field goes through a "zero" and the electron flow through the cathode jet divides; part flows with ions from the anode sheath 108 and from the cathode jet into the neutral exhaust beam 110, the remainder enter the anode sheath 108 and flow toward the anode 74, continuing to gain energy. As they enter the anode housing 72, 74 in the form of an annular sheath they encounter many atoms. Because of the high electron energy, most electron-atom collisions are ionizing collisions. The ions thus produced are accelerated radially by the strong radial electric field in this region, but are turned azimuthally by the solenoidal magnetic field. The expanding solenoidal magnetic field and the positive axial electric field in the anode sheath both act to accelerate the ions axially away from the anode. These ions eventually enter the plasma exhaust beam. The anode housing 74 is made long enough to confine the propellant injected through 76 long enough to have most of it ionized by passing through the anode sheath. The distance between the cathode-buffer (21) and the position where the current terminates (31) is given approximately by:

$$L = \frac{\Phi_A{}^2 (\sigma kT)\text{avg.} \left( \dfrac{\dot{m}}{m_a} + \dfrac{I}{|e|} \right)}{8\pi (P_a \pi R_c{}^2)}$$

where, $\Phi_A = \pi R_A{}^2 (\overline{B_z})_A$
$R_A$    inner radius of anode.
$(\overline{B_z})_A =$ average strength of the axial magnetic field at the anode.
$\sigma =$ electrical conductivity of the gas in the cathode jet.
$k =$ Boltzman's constant.
$T =$ gas (electron) temperature.
$\dot{m} =$ mass flow rate in the cathode jet.
$m_a =$ mass of an atom of gas flowing in the cathode jet.
$I =$ current flowing thru the cathode jet.
$|e| =$ charge in the electron.

$$P_a \pi R_c{}^2 = \dot{m} \sqrt{\frac{2kT}{\gamma m_a}}.$$

$\gamma =$ ratio of specific heats.

Values for the above quantities could be:

$$\Phi_A = II \times (qp^{-2})^2 \times .1$$
$$= 3.14 \times 10^{-5}$$
$$\Phi kT = 20{,}000 \times 1.38 \times 10^{-23} \times 10^5$$
$$= 2.76 \times 10^{-4}$$

$$\frac{\dot{m}}{m_a} \quad \frac{I}{|e|} = \frac{10^{-6}}{1.67 \times 10^{-27}} + \frac{100}{1.6 \times 10^{-19}}$$
$$= 1.224 \times 10^{21}$$

$$P_a \pi R_c{}^L = 10^{-6} \sqrt{\frac{2 \times 1.38 \times 10^{-23} \times 10^5}{1.67 \times 1.67 \times 10^{-27}}}$$
$$= 3.146 \times 10^{-2}.$$

$$L = \frac{(3.14 \times 10^{-5})^2 \times 1.224 \times 10^{21} \times 2.76 \times 10^{-14}}{8\pi \times 3.146 \times 10^{-2}}$$
$$= 4.21 \times 10^{-2} \text{ meters}$$
$$= 1.66 \text{ inches}$$

If the magnetic field were increased from 1000 gauss to 2000 gauss, the distance L would increase to 6.63 inches.

The arc current, the mass flow rate and the strength of the applied magnetic field are adjusted so that they meet the requirements of the minimum voltage hypothesis for single ionization of the propellant atoms. The plasma beam then has an exhaust velocity equal to the Alfvén speed of the gas. While conducting experiments with an arc transverse to a magnetic field, Alfvén found that he could not increase the velocity of the discharge through the gas beyond a certain value. This "critical" speed was different for different gases, but correlated using the formula:

$$v_{cr} = \sqrt{\frac{2|e|V_I}{m_I}}$$

where, $|e| =$ charge on electron.
$V_I =$ first ionization potential of the atom
$m_I =$ mass of the ion.

This critical velocity, $v_{cr}$, became known as the Alfvén speed.

When the implications of the minimum voltage hypothesis were worked out for plasma accelerators by applicant, the analysis indicated that the exhaust velocity of the plasma beam out of the accelerator should be equal to this critical or Alfvén velocity, provided adequate propellant mass flow was available. If inadequate mass flow were provided, then a number of things could happen:

(1) The electron temperature could rise and ionize in multiple fashion the propellant atoms (resulting in a higher effective Alfvén velocity).

(2) The discharge could increase in volume and ionize ambient gas which was then injected into the plasma beam.

(3) The discharge could evaporate and ionize material from the cathode, or the anode, or from insulators and inject this into the plasma beam.

(4) The discharge could go unstable.

FIGS. 1–3 can be used to illustrate the test procedure of the invention. Inasmuch as thruster 10, according to the present invention, is designed to operate in a vacuum environment, a special test facility is provided for ground testing. Thruster 10 is placed in a vacuum enclosure (not shown) with an outside exhaust duct (not shown) to provide connection with vacuum source (not shown). An alternate configuration (not shown) would duct the propellant exhaust directly from the expansion nozzle to the external vacuum supply. This method would permit achieving better vacuum conditions within vacuum enclosure by use of typical low flow, hard vacuum pumping systems such as by absorption pumps and/or ion pumps. Unlike augmented devices heated by free-standing coil heaters, ground testing in a terrestrial gravity environment will not impose any additional test or facility constraints.

Figure 9:
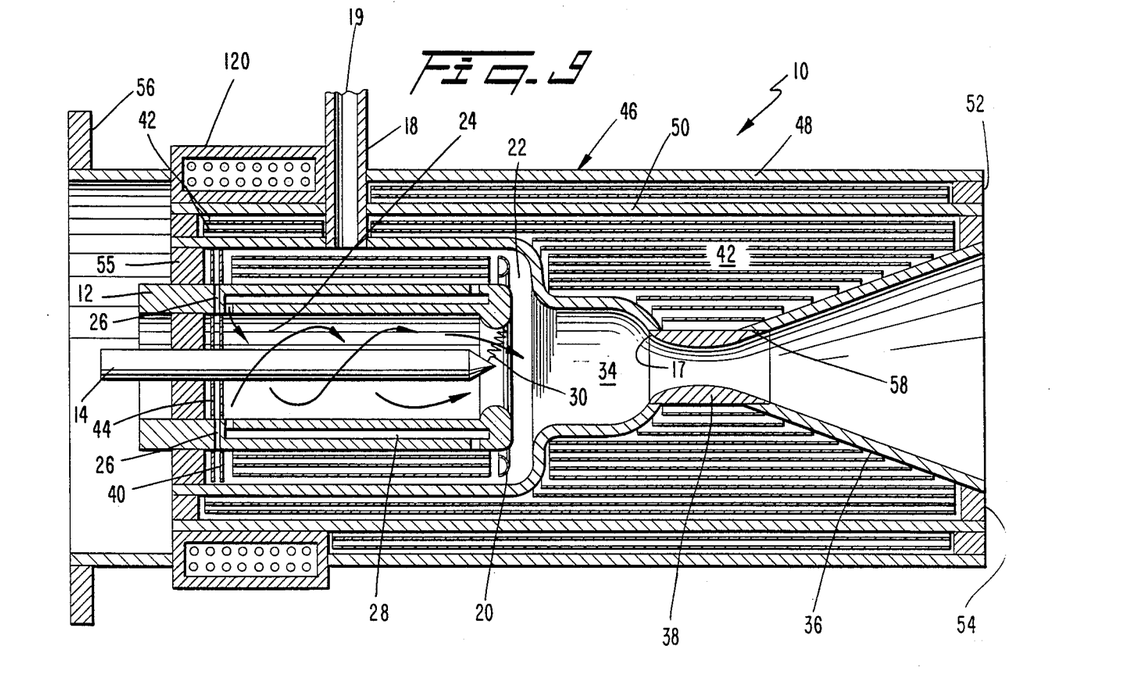
FIG. 9 shows an alternative embodiment of the thruster of FIG. 1 including the provision of an external preheater.

What has been described is a preferred embodiment of the invention. It should be noted that it is possible to provide various other arrangements. For example, if the fuel is injected into thruster 10 in the unreacted liquid state, an external heater 120 would be used as shown in FIG. 9 to pre-heat thruster 10 to a safe temperature above the thermal decomposition temperature, about 1000° K. This internal coupling of exothermic decomposition and electrical performance augmentation eliminates the heat losses from an external mounted decomposition chamber and from the connecting injection tube.

The foregoing detailed description is to be clearly understood as being given by way of illustration and example only, and the spirit and scope of this invention is intended only to be limited by the scope of the following appended claims.

I claim:

1. A thruster for use in an extraterrestrial vehicle comprising:
   (a) an outer casing;
   (b) a cathode mounted within said outer casing and having an end;
   (c) an anode mounted within said outer casing and spaced a predetermined distance from said cathode end, said predetermined distance defining a gap in which an arc is formed;
   (d) nozzle means mounted within said outer casing, and
   (e) fuel supply means for supplying propellant fuel to said thruster comprising:
      (i) an inlet conduit extending through said outer casing;
      (ii) first passageway means connecting said inlet conduit with an area within said outer casing adjacent said gap,
      (iii) said first passageway means including a supply conduit extending through said anode and including a portion thereof located upstream of said gap; and
      (iv) second passageway means extending from said inlet conduit and bypassing said arc.

2. The invention of claim 1, wherein said outer casing comprises an outer tubular member and an inner tubular member, said tubular members being separated by a first annular ring.

3. The invention of claim 2, wherein said nozzle means is supported by said inner tubular member.

4. The invention of claim 3, wherein a second annular ring is interposed between said nozzle means and said inner tubular member.

5. The invention of claim 4, wherein said second annular ring is made of boron nitride.

6. The invention of claim 4, wherein said second annular ring is made of titanium.

7. The invention of claim 3, wherein said thruster further includes a mixing chamber located between said gap and said nozzle means, said mixing chamber being connected to a further tubular member located within said inner tubular member and connected thereto at an end thereof remote from said nozzle means.

8. The invention of claim 7, wherein said anode is tubular in form and is located substantially concentrically within said further tubular member to thereby define a first space therebetween, said first space being substantially annular in form and comprising a portion of said passageway means; and an insulating member interposed between said anode and said further tubular member to thereby electrically insulate said anode from said outer casing.

9. The invention of claim 8, wherein said inlet conduit extends through said further tubular member and opens into said first space, and said first space includes flow dividing means and flow swirling means located therein and separating said inlet conduit from said supply conduit.

10. The invention of claim 9, wherein a second space is defined between said anode and said cathode upsteam of said gap.

11. The invention of claim 10, wherein said propellant fuel may travel from said inlet conduit to said nozzle means through a plurality of paths including:
   (a) a first path including said first space, said second passageway means and said mixing chamber;
   (b) a second path including said first space, said supply conduit, said second space and said mixing chamber, and
   (c) a third path including said first space, said second space and said mixing chamber.

12. The invention of claim 11, wherein said first path bypasses said gap and propellant fuel travelling in said first path acts to cool said mixing chamber and nozzle means.

13. The invention of claim 11, wherein propellant fuel travelling through said second path including said supply conduit acts to cool said anode, said supply conduit being tortuous in configuration and including portions extending substantially axially in said anode.

14. The invention of claim 11, wherein said third path includes a bypass conduit in said anode connecting said first space with said second space, said bypass conduit extending substantially radially through said anode.

15. The invention of claim 1, wherein said propellant fuel may travel from said inlet conduit to said nozzle means through a plurality of paths including:
   (a) a first path including said second passageway means and bypassing said gap;
   (b) a second path including said supply conduit and said gap, and
   (c) a third path bypassing said supply conduit and including said gap.

16. The invention of claim 1, wherein said nozzle means includes:
   (a) an inlet section;
   (b) a throat insert;
   (c) an expansion nozzle, and
   (d) a diaphragm between said throat insert and said expansion nozzle.

17. The invention of claim 16, wherein said diaphragm includes means for deflecting propellant fuel away therefrom.

18. The invention of claim 16, wherein said inlet section is made of molybdenum/rhenium, said throat insert is made of thoriated tungsten and said expansion nozzle is made of one of a molybdenum alloy or titanium.

19. The invention of claim 1, wherein a heater is mounted on said outer casing to enable preheating of said thruster.

20. The invention of claim 1, further comprising radiation shielding means within said outer casing for containing energy radiation caused by energizing of said propellant fuel within said outer casing and focusing said radiation toward said nozzle means.

21. The invention of claim 20, wherein said radiation shielding means comprises:
   (a) first shielding means between said cathode and anode and upstream of said gap, and
   (b) second shielding means surrounding said anode.

22. The invention of claim 21, wherein said second shielding means is located within said supply conduit.

23. The invention of claim 21, further comprising third shielding means located in surrounding relation to said nozzle means.

* * * * *